(12) United States Patent
Lai

(10) Patent No.: US 9,130,010 B2
(45) Date of Patent: Sep. 8, 2015

(54) LATCH-UP ROBUST SCR-BASED DEVICES

(75) Inventor: Da-Wei Lai, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 299 days.

(21) Appl. No.: 13/483,322

(22) Filed: May 30, 2012

(65) Prior Publication Data

US 2013/0320398 A1 Dec. 5, 2013

(51) Int. Cl.
*H01L 29/66* (2006.01)
*H01L 29/74* (2006.01)
*H01L 27/02* (2006.01)
*H02H 9/00* (2006.01)

(52) U.S. Cl.
CPC ........ *H01L 29/7436* (2013.01); *H01L 27/0262* (2013.01)

(58) Field of Classification Search
CPC . H01L 27/0262; H01L 29/7436; H01L 23/60; H01L 27/0259; H01L 27/0921; H01L 29/747

USPC ................... 438/133; 257/147, 355
See application file for complete search history.

(56) References Cited

U.S. PATENT DOCUMENTS

| | | | | |
|---|---|---|---|---|
| 5,754,380 | A * | 5/1998 | Ker et al. | 361/56 |
| 5,781,388 | A * | 7/1998 | Quigley | 361/56 |
| 6,614,078 | B2 * | 9/2003 | Lee et al. | 257/372 |
| 7,110,230 | B2 * | 9/2006 | Van Camp et al. | 361/56 |
| 2003/0042498 | A1 * | 3/2003 | Ker et al. | 257/173 |
| 2004/0195629 | A1 * | 10/2004 | Lai et al. | 257/355 |

* cited by examiner

*Primary Examiner* — Ori Nadav
*Assistant Examiner* — Ernest Allen, III
(74) *Attorney, Agent, or Firm* — Ditthavong & Steiner, P.C.

(57) ABSTRACT

An approach for providing a latch-up robust silicon control rectifier (SCR) is disclosed. Embodiments include providing a first N+ region and a first P+ region in a substrate for a SCR; providing first and second n-well regions in the substrate proximate the first N+ and P+ regions; providing a second N+ region in the first n-well region, and a second P+ region in the second n-well region; and coupling the first N+ and P+ regions to a ground rail, the second N+ region to a power rail, and the second P+ region to an I/O pad.

1 Claim, 7 Drawing Sheets

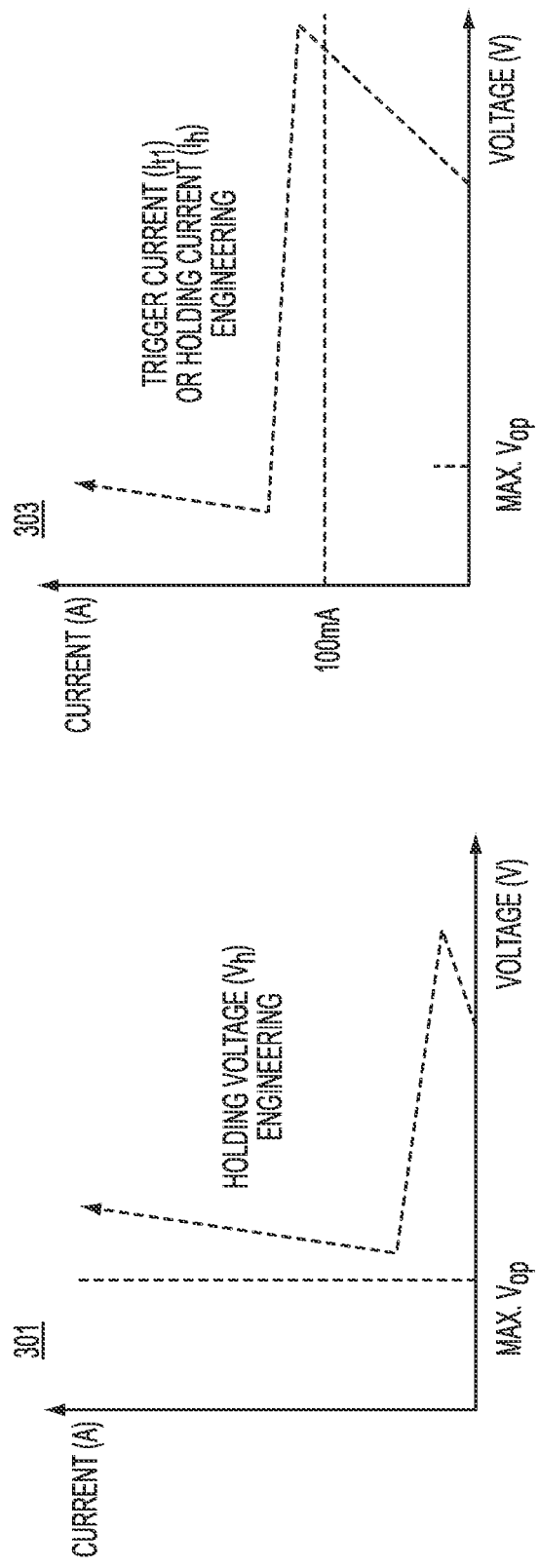

LATCH-UP ROBUST SCR-BASED DEVICES

TECHNICAL FIELD

The present disclosure relates to silicon control rectifier (SCR) devices. The present disclosure is particularly applicable to SCR-based electrostatic discharge (ESD) protection devices.

BACKGROUND

FIG. 1 schematically illustrates a traditional SCR-based ESD protection device. As shown, the device in FIG. 1 includes substrate 101 with p-well region 103 and n-well region 105, and shallow trench isolation (STI) region 107 between well regions 103 and 105. As depicted, p-well region 103 includes P+ region 109 and N+ region 111 coupled to ground rail 113 (e.g., VSS), and n-well region 105 includes P+ region 115 and N+ region 117 coupled to I/O pad 119. In general, SCR-based ESD protection devices provide robust ESD performance and compact size. However, typical SCR-based ESD protection devices suffer from latch-up issues. For example, an ESD event (e.g., from I/O pad 119 to ground rail 113) may induce reverse breakdown with respect to n-well region 105 and substrate 101. If there is enough charge to maintain parasitic PNP and NPN structures, latch-up path 121 may occur, causing disruptions with regard to proper functioning of a circuit (e.g., that the SCR-based device is supposed to protect) or even destruction of the circuit due to excess current.

FIG. 2 schematically illustrates characteristics of a traditional SCR-based ESD protection device under an ESD condition. As shown, in diagram 201, once the trigger voltage ($V_t$) is reached, the SCR-based ESD protection device will snapback to the holding voltage ($V_h$) (e.g., for maintaining the parasitic PNP and NPN structures). In addition, as depicted, a traditional SCR-based ESD protection device has a high trigger voltage (e.g., $V_{t1}$~10 V for logic process), a low trigger current (e.g., $I_{t1}$~mA), and a low holding voltage (e.g., $V_h$~2 V). Consequently, a traditional SCR-based ESD protection device fails to adequately provide protection from latch-up events (e.g., transient ESD-induced latch-ups, static latch-up testing, etc.). Although latch-up issues may be reduced by increasing the p-n junction space of the SCR and cascading the SCR to increase the holding voltage ($V_h$) of the SCR, such an approach consumes substantially more device/chip area than necessary, resulting in the need for larger device/chip size.

A need therefore exists for an efficient latch-up robust SCR-based device, and enabling methodology.

SUMMARY

An aspect of the present disclosure is a method for implementing a latch-up robust SCR-based device.

Another aspect of the present disclosure is a latch-up robust SCR-based device.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: providing a first N+ region and a first P+ region in a substrate for a SCR; providing first and second n-well regions in the substrate proximate the first N+ and P+ regions; providing a second N+ region in the first n-well region, and a second P+ region in the second n-well region; and coupling the first N+ and P+ regions to a ground rail, the second N+ region to a power rail, and the second P+ region to an I/O pad.

Another aspect includes providing a holding voltage of the SCR that is greater than a maximum operating voltage of the SCR during a latch-up event. Additional aspects include providing the holding voltage of the SCR by turning on the power rail. Some aspects include providing a third P+ region in the second n-well region. Various aspects include providing the third P+ region between the second N+ and P+ regions. Certain aspects include providing a third N+ region between the second and third P+ regions. Other aspects include: providing a resistor having first and second resistor terminals; providing a capacitor having first and second capacitor terminals; and coupling the third P+ region to the first resistor and capacitor terminals, the second resistor terminal to the ground rail, and the second capacitor terminal to the I/O pad.

Further aspects include: providing the first N+ and P+ regions on a first side of the first n-well region; and providing the second n-well region on a second side of the first n-well region, wherein the first side is opposite the second side. Some aspects include providing a holding current, a trigger current, or a combination thereof of the SCR that is greater than 100 milliamps (mA) during a latch-up event.

An additional aspect of the present disclosure is a device including: a first N+ region and a first P+ region in a substrate; first and second n-well regions in the substrate proximate the first N+ and P+ regions; a second N+ region in the first n-well region; and a second P+ region in the second n-well region, wherein the first N+ and P+ regions are coupled to a ground rail, the second N+ region is coupled to a power rail, and the second P+ region is coupled to an I/O pad.

Another aspect includes a device having a holding voltage that is greater than a maximum operating voltage of the device during a latch-up event. Additional aspects include the holding voltage of the device being provided by the power rail being turned on. Some aspects include a device having a third P+ region in the second n-well region. Certain aspects include a device having the third P+ region be between the second N+ and P+ regions. Various aspects include a device having a third N+ region between the second and third P+ regions. Other aspects include a device having: a resistor with first and second resistor terminals; and a capacitor with first and second capacitor terminals, wherein the third P+ region is coupled to the first resistor and capacitor terminals, the second resistor terminal is coupled to the ground rail, and the second capacitor terminal is coupled to the I/O pad.

Further aspects include a device having the first N+ and P+ regions on a first side of the first n-well region, and the second n-well region on a second side of the first n-well region that is opposite the first side. Certain aspects include a device having a holding current, a trigger current, or a combination thereof of the SCR being greater than 100 mA during a latch-up event.

Another aspect of the present disclosure is a method including: providing a first n-well region in a substrate for a SCR; providing a first N+ region and a first P+ region in the substrate on a first side of the first n-well region; providing a second n-well on a second side of the first n-well region that is opposite the first side; providing a second N+ region in the first n-well region, and a second P+ region in the second n-well region; coupling the first N+ and P+ regions to a ground rail, the second N+ region to a power rail, and the second P+ region to an I/O pad; providing a holding voltage of the SCR that is greater than a maximum operating voltage of the SCR during a latch-up event by turning on the power rail.

Further aspects include: providing a third P+ region between the second N+ and P+ regions; providing a resistor having first and second resistor terminals; providing a capacitor having first and second capacitor terminals; and coupling the third P+ region to the first resistor and capacitor terminals, the second resistor terminal to the ground rail, and the second capacitor terminal to the I/O pad.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIGS. 3A and 3B schematically illustrate concepts to overcome latch-up issues;

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves problems of latch-up in a SCR ESD protection device attendant upon an ESD event. The present disclosure addresses and solves such problems, for instance, by, inter alia, providing a first N+ region and a first P+ region in a substrate for a SCR; providing first and second n-well regions in the substrate proximate the first N+ and P+ regions; providing a second N+ region in the first n-well region, and a second P+ region in the second n-well region; and coupling the first N+ and P+ regions to a ground rail, the second N+ region to a power rail, and the second P+ region to an I/O pad.

FIGS. 3A and 3B schematically illustrate concepts to overcome latch-up issues. For example, according to latch-up specifications, latch-up risk may be eliminated if the holding voltage ($V_h$) of an SCR is greater than the maximum operating voltage (max. $V_{op}$) (e.g., diagram 301 of FIG. 3A). Moreover, latch-up issues may be overcome by setting the trigger current ($I_t$) or the holding current ($I_h$) of the SCR to be greater than 100 mA (e.g., diagram 303 of FIG. 3B).

Figure 1:
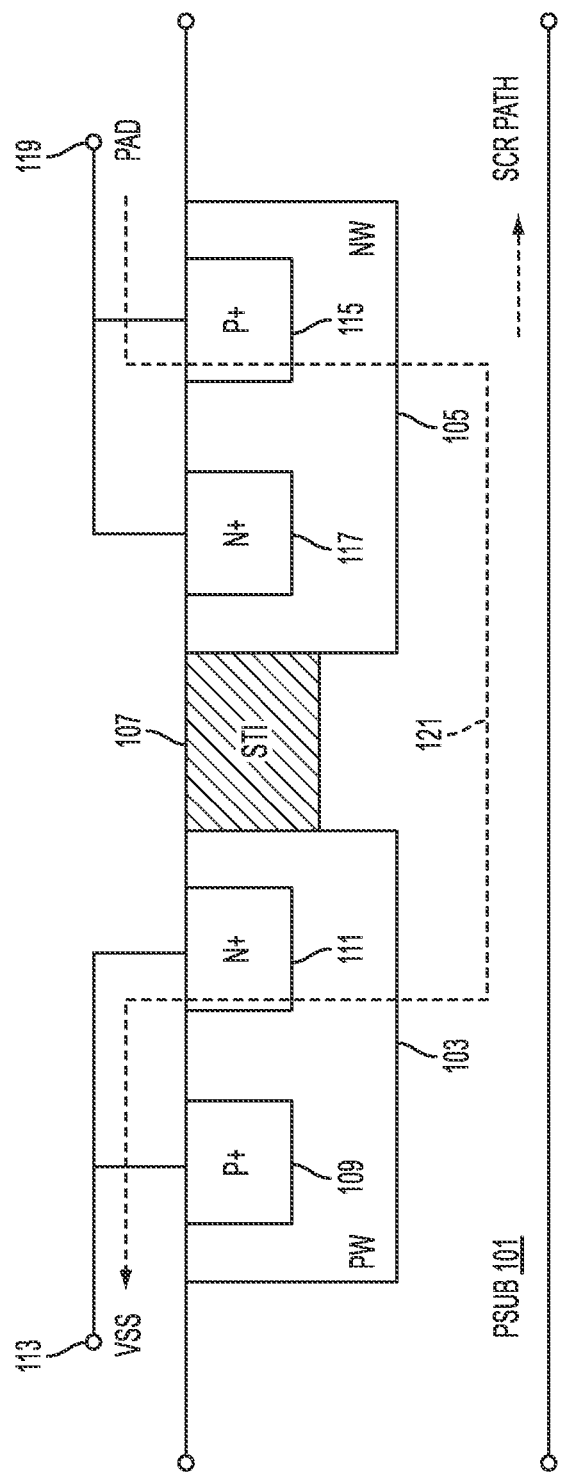
FIG. 1 schematically illustrates a traditional SCR-based ESD protection device.
Figure 2:
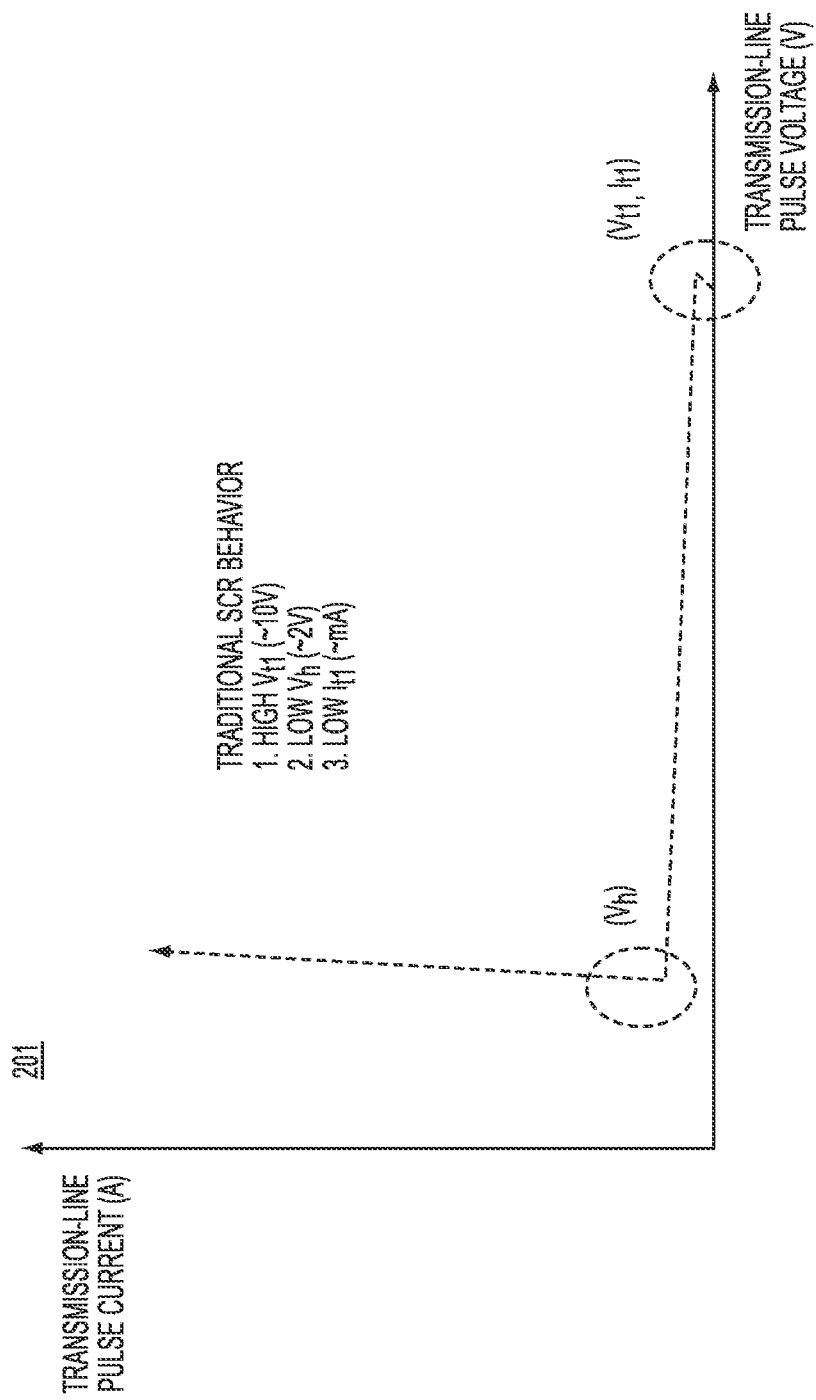
FIG. 2 schematically illustrates characteristics of a traditional SCR-based ESD protection device under ESD condition.
Figure 4A:
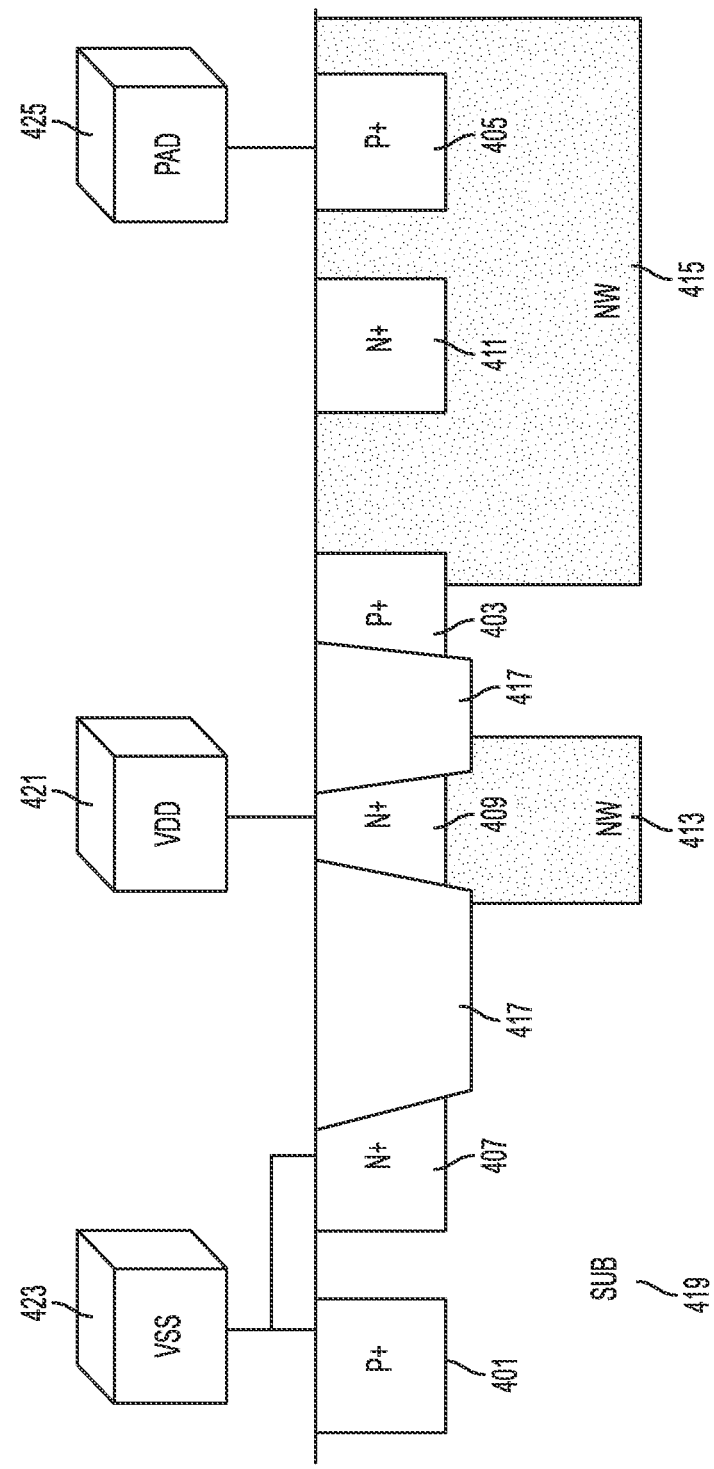
FIGS. 4A and 4B schematically illustrate latch-up robust SCR-based devices, in accordance with exemplary embodiments of the present disclosure.
Figure 4B:
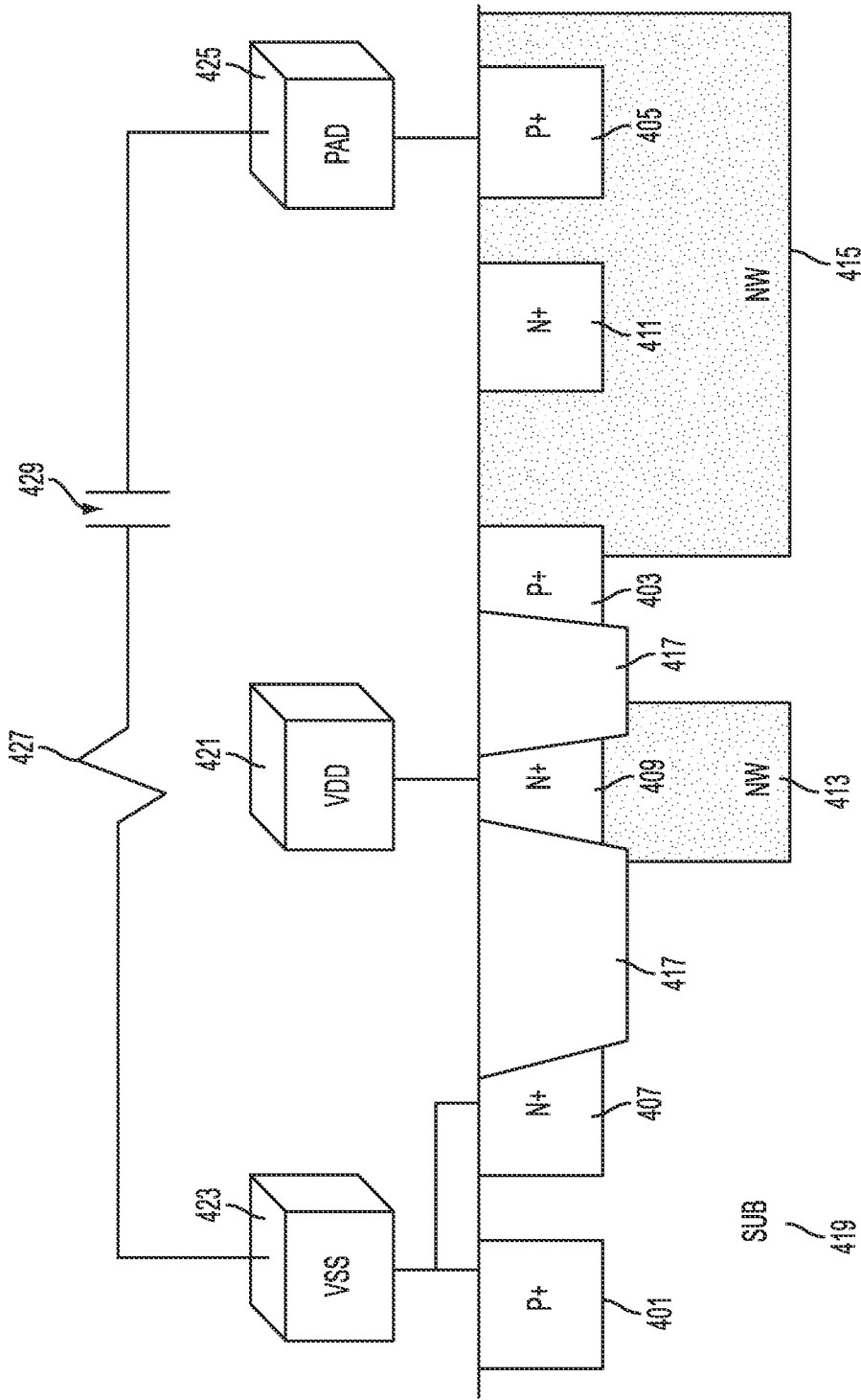

FIGS. 4A and 4B schematically illustrate latch-up robust SCR-based devices, in accordance with exemplary embodiments of the present disclosure. For example, FIG. 4A illustrates a structure with various P+ regions (e.g., P+ regions 401, 403, and 405), N+ regions (e.g., N+ regions 407, 409, and 411), well regions (e.g., n-well regions 413 and 415), and STI regions (e.g., STI regions 417) embedded in substrate 419. As depicted, n-well region 413 includes N+ region 409, and n-well region 415 includes P+ regions 403 and 405 along with N+ region 411. Compared with a traditional SCR-based device, the structure in FIG. 4A includes an additional N+ region 409 that is coupled to power rail 421. As such, power rail 421 and N+ region 409 may be utilized to set a high holding voltage ($V_h$) for the SCR-based structure, for instance, during static latch-up testing or transient ESD-induced latch-up testing. P+ region 401 and N+ region 407 may be coupled to ground rail 423, and P+ region 405 may be coupled to I/O pad 425, similar to corresponding components in conventional SCR-based structures.

Moreover, the structure in FIG. 4A includes an additional P+ region 403 to reduce the trigger voltage ($V_t$) of the SCR-based structure during an ESD event. Furthermore, a sensing approach may be utilized to further reduce the trigger voltage ($V_t$). For example, FIG. 4B illustrates a RC trigger approach that includes coupling first ends of resistor 427 and capacitor 429 to P+ region 403, another end of resistor 427 to ground rail 423, and another end of capacitor 429 to I/O pad 425. Furthermore, N+ region 411 may be removed from the SCR-based structures of FIGS. 4A and 4B to reduce their size, for example, to free up chip area for other components.

Figure 5A:
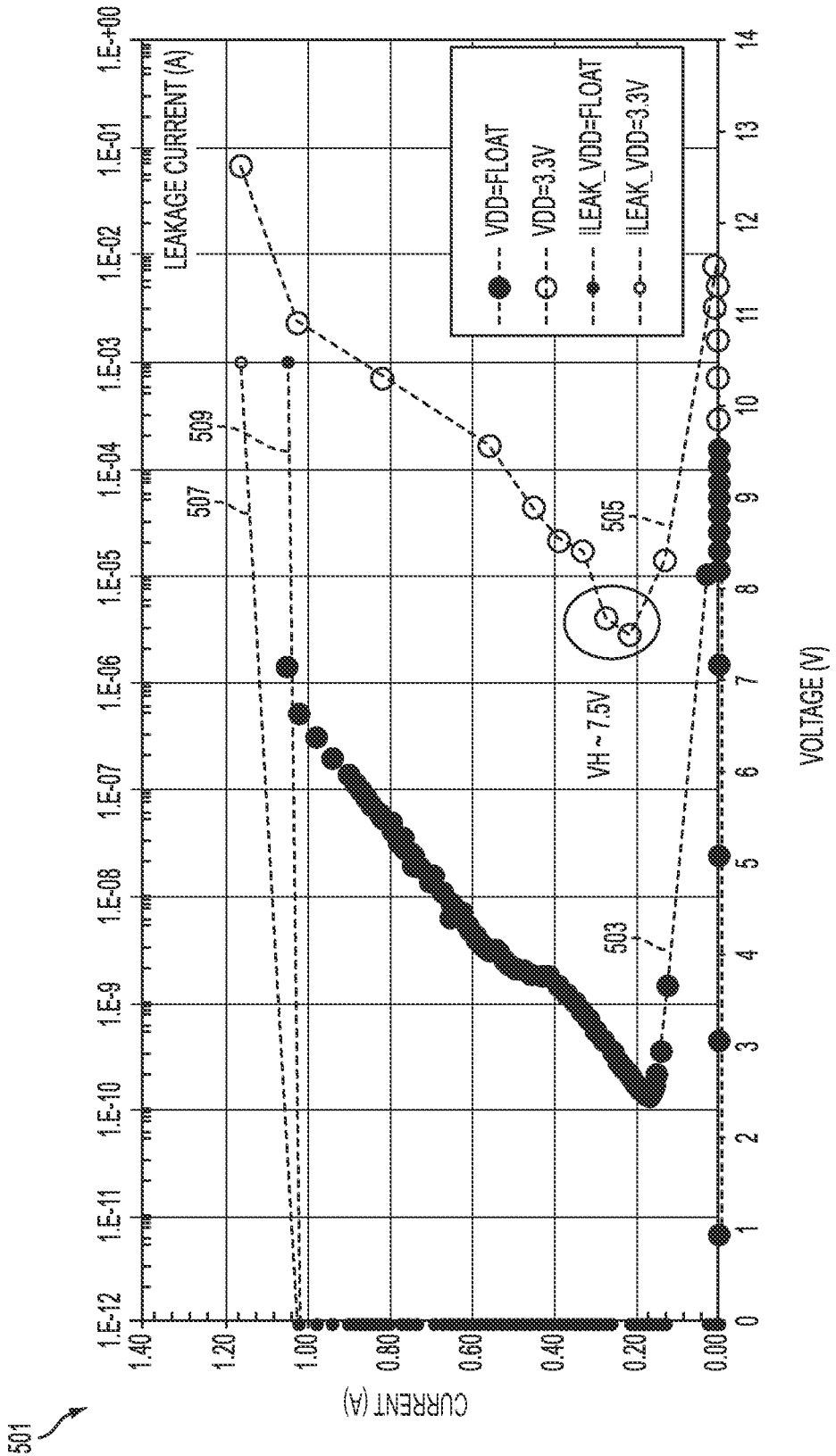
FIGS. 5A and 5B schematically illustrate characteristics of latch-up robust SCR-based devices, in accordance with exemplary embodiments of the present disclosure.
Figure 5B:
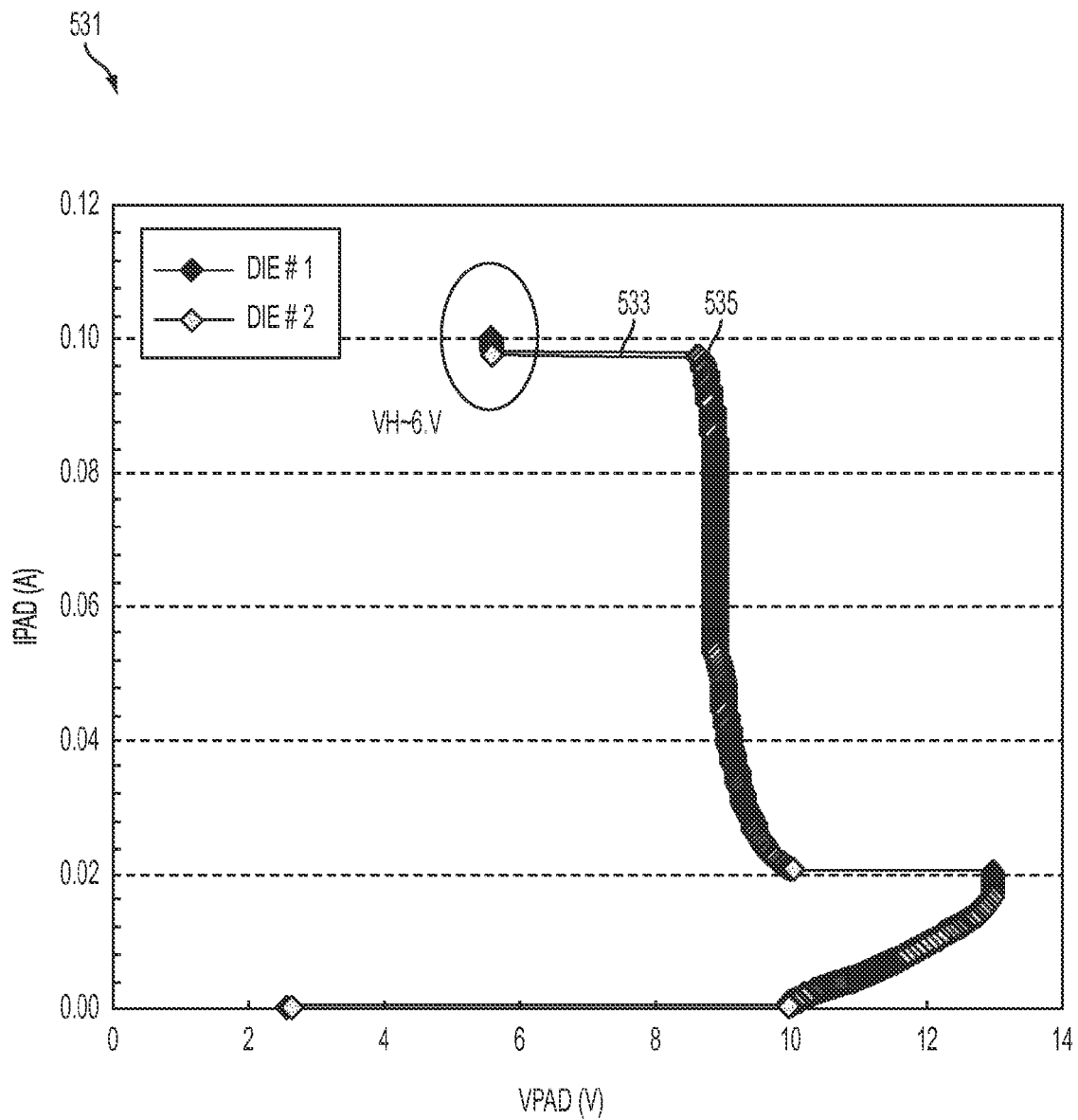

FIGS. 5A and 5B schematically illustrate characteristics of latch-up robust SCR-based devices, in accordance with exemplary embodiments of the present disclosure. For example, FIG. 5A illustrates transmission-line pulse (TLP) characteristics of a latch-up robust SCR-based device under PAD to VSS ESD testing conditions where the maximum operating voltage (max. $V_{op}$) of the SCR-based device is 3.6 V. Diagram 501, for instance, includes curve 503 to represent the holding voltage ($V_h$) of the SCR-based device when VDD (e.g., power rail 421) is floating, curve 505 to represent the holding voltage ($V_h$) when VDD is biased (e.g., set to 3.3 V), and curves 507 and 509 to represent the respective leakage currents. As shown, the latch-up robust SCR-based device produces characteristics similar to a traditional SCR-based device due to a low holding voltage ($V_h$) when VDD is floating (e.g., curve 503). Nonetheless, as a result of a low trigger voltage (e.g., $V_{t1}$~9.3 V), the latch-up robust SCR-based device may still provide adequate protection. However, when VDD is biased to 3.3 V (e.g., VDD is turned on), the holding voltage of the SCR-based device increases from 2.3 V to 7.5 V, which is more than twice the maximum operating voltage (max. $V_{op}$) of 3.6 V. Accordingly, there will be no transient ESD-induced latch-up problem (e.g., since the holding voltage ($V_h$) is significantly greater than the maximum operating voltage (max. $V_{op}$)).

Moreover, FIG. 5B illustrates direct current (DC) characteristics of latch-up robust SCR-based devices with VDD biasing conditions where the maximum operating voltages of the SCR-based devices are 3.6 V. In this scenario, 100 mA is forced into the PAD node (e.g., I/O pad 425) to produce measurements under static latch-up testing conditions. As shown, in diagram 531, both SCR-based devices (e.g., DIE #1 and DIE #2 represented by curves 533 and 535) will snapback to holding voltages of 6 V, which is greater than the maximum voltages of 3.6 V. Therefore, as discussed, there will be no latch-up issues when the holding voltage ($V_h$) of each SCR-based device is greater than its maximum operating voltage (max. $V_{op}$) of 3.6 V.

The embodiments of the present disclosure can achieve several technical effects, including latch-up robustness for SCR-based devices with minimal impact on device size and chip area. Embodiments of the present disclosure enjoy utility in various industrial applications as, for example, microprocessors, smart phones, mobile phones, cellular handsets, set-top boxes, DVD recorders and players, automotive navigation, printers and peripherals, networking and telecom equipment, gaming systems, digital cameras, or any other devices utilizing logic or high-voltage technology nodes. The present disclosure therefore enjoys industrial applicability in any of various types of highly integrated semiconductor devices, including devices that use ESD protection devices to pass ESD/latch-up standards specifications (e.g., liquid crystal display (LCD) drivers, synchronous random access memories (SRAM), One Time Programming (OTP), and power management products).

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
providing a first n-well region in a substrate for a silicon control rectifier (SCR);
providing a first N+ region and a first P+ region in the substrate on a first side of the first n-well region;
providing a second n-well region on a second side of the first n-well region that is opposite the first side;
providing a second N+ region in the first n-well region, and a second P+ region in the second n-well region;
coupling the first N+ and P+ regions to a ground rail, the second N+ region to a power rail, and the second P+ region to an I/O pad;
providing a holding voltage of the SCR that is greater than a maximum operating voltage of the SCR during a latch-up event by turning on the power rail;
providing a third P+ region between the second N+ and P+ regions;
providing a resistor having first and second resistor terminals;
providing a capacitor having first and second capacitor terminals; and
coupling the third P+ region to the first resistor and capacitor terminals, the second resistor terminal to the ground rail, and the second capacitor terminal to the I/O pad.

* * * * *